United States Patent [19]

Hayashi

[11] Patent Number: 5,283,466
[45] Date of Patent: Feb. 1, 1994

[54] LEAD FRAME FOR SEMICONDUCTOR DEVICE OF THE RESIN ENCAPSULATION TYPE

[75] Inventor: Kazunori Hayashi, Yokohama, Japan

[73] Assignee: Kabushiki Kaisha Toshiba, Kawasaki, Japan

[21] Appl. No.: 766,080

[22] Filed: Sep. 27, 1991

[30] Foreign Application Priority Data

Sep. 27, 1990 [JP] Japan ................. 2-258618

[51] Int. Cl.$^5$ ............................................. H01L 23/48
[52] U.S. Cl. ..................................... 257/667; 257/670; 257/692; 257/696
[58] Field of Search ................. 357/70; 257/667, 670, 257/692, 696

[56] References Cited

U.S. PATENT DOCUMENTS 4,477,827 10/1984 Walker et al. ..................... 357/70
4,514,750 4/1985 Adams ............................ 257/670
4,916,506 4/1990 Gagnon ............................. 357/70

FOREIGN PATENT DOCUMENTS 0118237 9/1984 European Pat. Off. .
61-23351 1/1986 Japan .
61-245556 10/1986 Japan .

Primary Examiner—Robert J. Pascal
Assistant Examiner—R. A. Ratliff
Attorney, Agent, or Firm—Foley & Lardner

[57] ABSTRACT

A lead frame for a semiconductor device provided with package suspension leads that have one end portion connected to an outer frame and that have the side of the other end portion extending into a resin encapsulation region, and island suspension leads that have one end portion connected to the side portion of the island that does not oppose the outer frame, and another end portion extending and connected to the outer frame in the direction of the side of the island so that a region of a depressed portion is obtained.

14 Claims, 2 Drawing Sheets

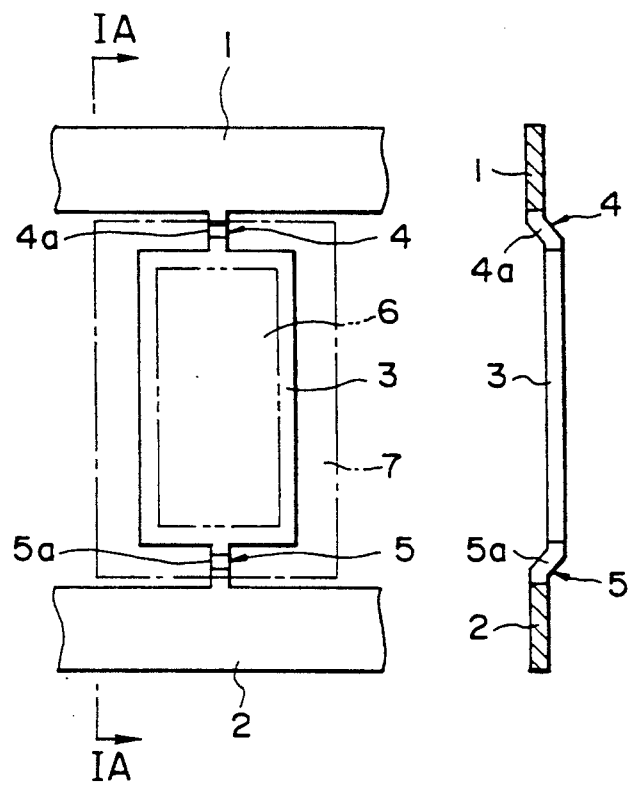
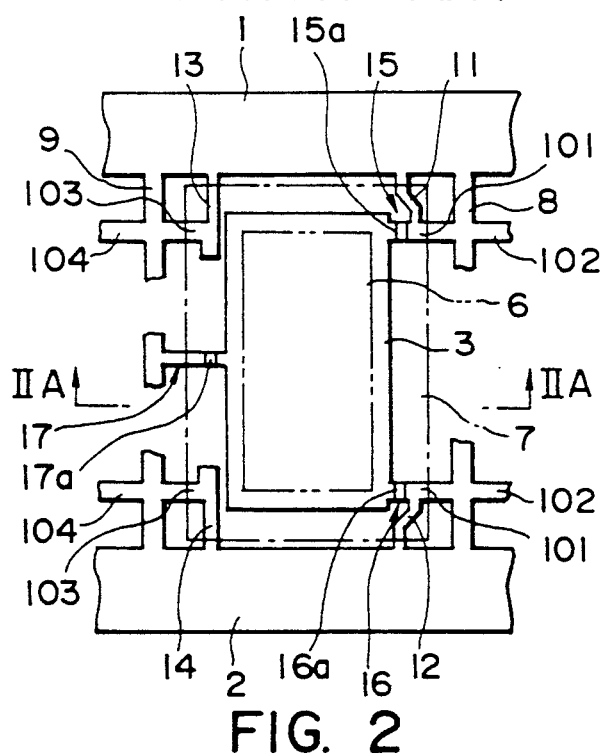
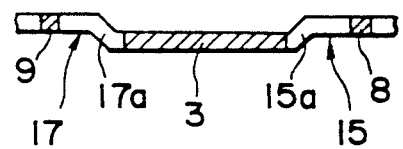
FIG. 1 PRIOR ART    FIG. 1A PRIOR ART
FIG. 2
FIG. 2A

LEAD FRAME FOR SEMICONDUCTOR DEVICE OF THE RESIN ENCAPSULATION TYPE

BACKGROUND OF THE INVENTION

The present invention relates to lead frames for semiconductor devices of the resin encapsulation type and more particularly, relates to frames that have frames formed at different levels of a surface of an outer frame and a surface positioned as an island, and where the lead frame is completely encapsulated by resin when resin encapsulation of the depressed portion is performed.

FIG. 1 is a view of a lead frame that is a part configuring a semiconductor device of the small-outline J-leaded package (SOJ) type, and for simplicity of description, the inner leads and their supporting portions have been omitted.

In FIGS. 1 and 1A, numerals 1 and 2 are outer frames, and these outer frames 1 and 2 are supported at constant intervals by inner lead bridge members that extend parallel and which are not shown in the figure.

The numeral 3 is an island, and the numerals 4 and 5 are island suspension leads. The island 3 is supported by the outer frames 1 and 2 via the island suspension leads 4 and 5.

These island suspension leads 4 and 5 are between the outer portion of each of the outer frames 1 and 2 of the island 3 and the respectively corresponding outer frames 1 and 2, and respectively bridge between the end portions on the side of the outer frame 2 of the island 3 and the outer frame 2, and the end portion of the outer fame 1 of the island and the outer frame 1.

The integrated circuit (IC) is, formed as described in the following, using a lead frame that has a configuration such as this.

First, a chip 6 is mounted on the island 3 and bonding is performed between the inner lead and the electrode of this chip 6.

Then, resin molding is used to perform resin encapsulation of the island 3, the chip 6 and the inner leads and the like. In the figure, numeral 7 is this resin encapsulation region.

After this, the island suspension leads 4 and 5 are cut and the distal end of the outer lead is separated from the lead frame, and forming of the outer leads is performed.

Finally, the island suspension leads 4 and 5 are separated from the outer frames 1 and 2 and a single IC is completed.

However, the island 3 is depressed with respect to the other portions of the lead frame, and the portions indicated by 4a and 5a in the island suspension leads 4, 5 is a curved portion that is the result of the formation of the depressions, that is, it is a distal end of a depression. This depression maintains a sufficient distance between the corner of the chip 6 and the bonding wire when bonding is performed, and prevents contact between the wire and the chip 6.

The bent portions (the depression end portions) 4a, 5a in these island suspension leads 4 and 5 are proved so as to be housed inside the resin encapsulation region 7. The reason for this is that having the bent portions 4a and 5a extending midway from the resin encapsulation region 7 means that they are sandwiched by the mold when molding is performed and this causes them to be deformed. A special mold is therefore required to prevent this.

However, along with the recent large sized chips it is not possible to sufficiently maintain the distance between the outer frames 1 and 2 and the island end portion 3 so that the bent portions 4a and 5a can be accommodated inside the resin encapsulation region 7, and there are occasions when a depression has to be omitted.

Along with the recent large-sized chips in conventional lead frames, there are therefore instances where it is not possible to sufficiently maintain the distance between the outer frames 1 and 2 and the island end portion 3 so that the bent portions 4a and 5a can be accommodated inside the resin encapsulation region 7.

SUMMARY OF THE INVENTION

In the light of the problems associated with the conventional technology as has been described above, the present invention has as an object the provision of a lead frame that enables the distance between the outer frame and the island end portion to be maintained sufficiently so as to allow the accommodation of the depression end portion inside the resin encapsulation region.

The lead frame of the present invention is provided with package suspension leads that have one end portion connected to an outer frame and that have the side of the other end portion extending into the resin encapsulation region, and island suspension leads that have one end portion connected to the side portion of the island that does not oppose said outer frame, and a side of another end portion extending and connected to said outer frame in the direction of the side of said island so that a region of that depression portion is obtained.

In the present invention, the amount that the bonding portion of the inner leads are accommodated into the package by the positioning and resin encapsulation in the direction of the side of the island is relatively large when compared to the amount required to accommodate the depression end portion inside the package and so according to the present invention, the region to accommodate the depression in the direction of the island side is obtained and so it is possible to have depression processing even in cases when the distance between the outer frame and the island end portion is not sufficient for the depression end portion to be accommodated inside the resin encapsulation region.

According to the present invention as has been described above, island suspension leads extend in the direction of the side of the island and create a region for a depression in the direction of the side of the island and so it is possible to have depression processing even in cases when the distance between the outer frame and the island end portion is not sufficient for the depression end portion to be accommodated inside the resin encapsulation region.

BRIEF DESCRIPTION OF THE DRAWINGS

In the appended figures,

FIG. 1 is a plan view of a conventional lead frame, and FIG. 1A is a sectional view along IA—IA of FIG. 1;

FIG. 2 is a plan view of a lead frame relating to a first embodiment of the present invention, and FIG. 2A is a sectional view along IIA—IIA of FIG. 2;

DETAILED DESCRIPTION OF THE PREFERRED EMBODIMENTS

Figure 3:
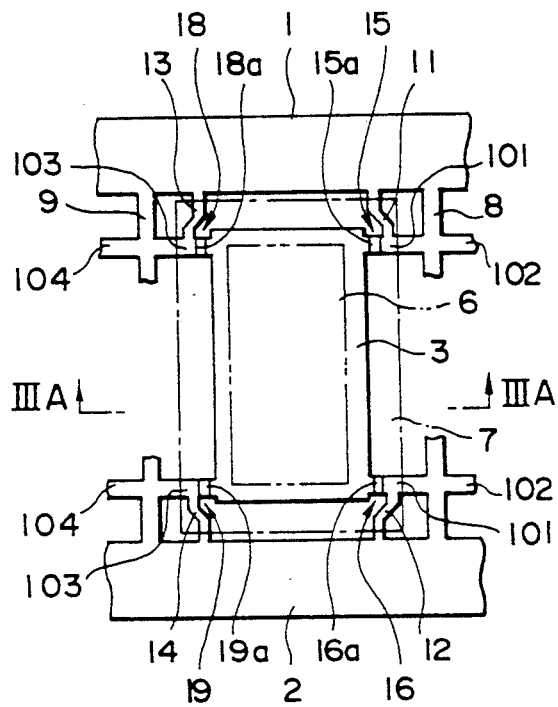
FIG. 3 is a plan view of a lead frame relating to a second embodiment of the present invention.

The following is a description of embodiments of the present invention, with reference to the appended drawings.

FIG. 2 and 2A show a lead frame relating to a first embodiment of the present invention, with FIG. 2 being a plan view and FIG. 2A being a sectional view along IIA—IIA of FIG. 2.

In FIGS. 2 and 2A, numeral 8 is a dam bar. This dam bar 8 is provided to a portion of one side of an island 3, and bridges the two outer frames 1 and 2 so as to support inner leads 101 and outer leads 102. Numeral 9 is a dam bar that is provided to a portion of a side which is opposite the island 3, and this dam bar 9 supports inner leads 103 and outer leads 104.

In the vicinity of the four corners of the island 3 and between the outer frames 1 and 2 are provided package suspension leads 11 through 14.

The package suspension lead 11 has one end portion connected to the outer frame 1 in the vicinity of the dam bar 8, and the other end portion enters from this outer frame 1 into the resin encapsulation region 7, and connects to the inner lead 101 that is closest to the outer frame 1.

The package suspension lead 12 has one end portion connected to the outer frame 2 in the side closest to the dam bar 8, and the other end portion enters from the outer frame 2 into the resin encapsulation region 7 and connects to the inner lead 101 that is closest to the outer frame 2.

The package suspension lead 13 has one end portion connected to the outer frame 1 on the side that is closest to the dam bar 9 and the other end portion enters from the outer frame 1 to into the resin encapsulation region 7 and connects to the inner lead which is closest to the outer frame 1.

The package suspension lead 14 has one end portion connected to the outer frame 2 in the side closest to the dam bar 9, and the other end portion enters from this outer frame 2 to into the resin encapsulation region 7 and connects to the inner lead 103 that is closest to the outer frame 2.

The inner leads 101 and 103 are non-connecting (NC) leads. Of these leads, the side that connects with the dam bar 8 of the inner lead 101 on the side that is closest to the outer frame 1, has the end portion of the opposite side connected to the island 3, and is an island suspension lead 15. The side that connects with the dam bar 8 of the inner lead 101 on the side that is closest to the outer frame 2, also has the end portion of the opposite side connected to the island 3, and is an island suspension lead 16. These island suspension leads 15 and 16 are positioned between the island 3 and the dam bar 8.

An island suspension lead 17 is provided between the island 3 and the dam bar 9 and one end of this island suspension lead 17 is connected to the portion of the side that is opposite the dam bar 9 of the island 3, and the other end portion is connected to the dam bar 9.

To each of the island suspension leads 15 through 17 are formed bent portions 15a, 16a and 17a as a result of the depression of the island 3, and these bent portions 15a, 16a and 17a are equivalent to the depression end portions.

These bent portions 15a, 16a and 17a are smaller than the amount that the inner leads 101 and 103 enter the resin encapsulation region 7 and are completely accommodated inside the resin encapsulation region 7.

An IC using a lead frame having such a configuration is formed in the following manner.

First, the chip 6 is mounted on the island 3 and with the exception of the NC leads, the inner leads 103, 103 . . . have wire bonding performed between the electrodes on the chip 6.

Then, resin encapsulation by resin molding is performed for the island 3, the chip 6 and the inner leads 103 and the like. The numeral 7 represents the resin encapsulation region as described above.

After this, the dam bars 8 and 9 and the island suspension lead 17 are cut and the distal end portions of the outer leads 102 and 104 are separated from the lead frame. When this is done, the island suspension leads 15 and 16 form a single unit with the inner lead 101. Then, after the outer leads 102 and 104 have been cut, forming is performed for these outer leads 102 and 104.

Finally, the package suspension leads 11 through 14 are separated from the outer frames 1 and 2 and the formation of a single IC is completed.

According to this embodiment as has been described above, the island suspension leads 15 through 17 extend in the direction of the side of the island 3 and ensure the region for the depression end portion in the direction of the side of the island 3 and so even when depression processing is performed, the relationship with the size of the chip means that the use of this lead frame enables a sufficient distance between the outer frames 1 and 2 and the distal end portion of the island 3 to be obtained so that the depression end portion can be accommodated inside the resin encapsulation region 7.

Figure 3A:
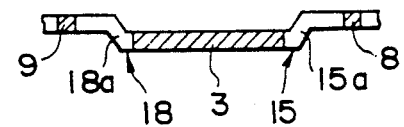
FIG. 3A is a sectional view along IIIA—IIIA of FIG. 3.

FIGS. 3 and 3A show a lead frame relating to a second embodiment of the present invention, with FIG. 3 being a plan view and FIG. 3A being a sectional view along IIIA—IIIA of FIG. 3.

In the figure, the island suspension leads are configured from only that portion which is drawn from the inner leads and so this is effective in cases where there are inner leads that become NC leads on both sides of the island.

This is to say that first of all, the configuration on the side of the dam bar 8 is the same as that shown for the first embodiment in FIG. 2A in which the lead frame of the second embodiment also has island suspension leads 15 and 16.

Then, in the case of the second embodiment, the inner leads 103 and 103 that are respectively the closest of the inner leads 103, 103 . . . on the side of the dam bar 9, to the outer frames 1 and 2 become the NC leads. Of these, the side that connects with the dam bar 9 of the inner lead 103 on the side that is closest to the outer frame 1 has the end portion of the opposite side connected to the island 3, and is the island suspension lead 18. The side that connects with the dam bar 9 of the inner lead 103 on the side that is closest to the outer frame 2 has the end portion of the opposite side connected to the island 3, and is the island suspension lead 19. These island suspension leads 18 and 19 are positioned between the island 3 and the dam bar 9.

The bent portions 18a and 19a are respectively formed by the depression, in these island suspension leads 18 and 19 and these bent portions 18a and 19a are accommodated inside the resin encapsulation region 7.

A lead frame of this second embodiment has the same effect as the lead frame of the first embodiment.

Figure 4:
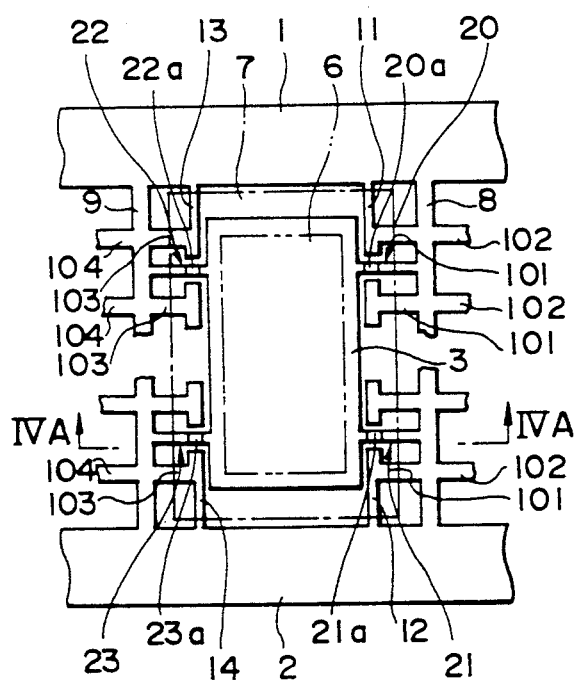
FIG. 4 is a plan view of a lead frame relating to a third embodiment of the present invention.
Figure 4A:
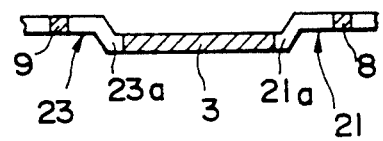
FIG. 4A is a sectional view along IVA—IVA of FIG. 4.

FIGS. 4 and 4A show a lead frame relating to a third embodiment of the present invention, with FIG. 4 being a plan view and FIG. 4A being a sectional view along IVA—IVA of FIG. 4.

Conversely to the second embodiment shown in FIG. 3, the third embodiment shown in FIG. 4 has the island suspension leads configured from only the portions that are drawn from the dam bars 8 and 9 and so is effective when there are no NC leads on both sides of the island 3.

In FIGS. 4 and 4A, the island suspension leads 20 and 21 are first provided between the island 3 and the dam bar 8. The island suspension leads 20 and 21 respectively have one end portion connecting the side portion that is opposite the dam bar 8 of the island 3, and the other end portion connecting to the dam bar 8, while the island suspension lead 20 is positioned on the side closest to the outer frame 1, and the island suspension lead 21 is positioned on the side closest to the outer frame 2, and placed so that there is as large a gap as possible between them so as to provide increased strength.

Island suspension leads 22 and 23 are provided between the island 3 and the dam bar 9. These island suspension leads 22 and 23 respectively have one end portion connecting to the side portion opposing the dam bar 9 of the island 3, and the other end portion connecting to the dam bar 9, while the island suspension lead 22 is positioned on the side closest to the outer frame 1, and the island suspension lead 23 is positioned on the side closest to the outer frame 2, and placed so that there is as large a gap as possible between them so as to provide increased strength.

To each of the island suspension leads 20 through 23 are formed bent portions 20a through 23a and these bent portions 20a through 23a are completely accommodated inside the resin encapsulation region 7.

Through the use of a lead frame according to this third embodiment, it is possible to obtain the same effect as the first embodiment.

What is claimed is:

1. A lead frame of a depression type for a semiconductor device of a resin encapsulation type, including package suspension leads for interconnecting an outer frame and a resin encapsulation region, and island suspension leads at least having a depressed portion for positioning of an island in a surface parallel to a surface of said outer frame, wherein said lead frame comprises:
a pair of outer frames which are provided parallel to each other and at a constant distance;
said island having a required shape and laid out between said outer frames, and having a semiconductor chip mounted thereon and which is to be resin encapsulated along with a carrier chip in said resin encapsulation region;
a pair of dam bars which bridge said pair of outer frames and which are separated by a constant distance from said island on each of two sides of said island;
wherein a plural number of said package suspension leads protrude from said outer frames into said resin encapsulation region and support a package when there is resin encapsulation;
wherein said island suspension leads respectively have one end connected to said pair of dam bars, and another end connected to said island, and wherein each said another end is connected to a side portion of said island which does not oppose said outer frames, and wherein at least some of said island suspension leads further include yet another end extending and connected to said outer frames in the direction of a side of said island so that island suspension leads are obtained, and wherein said island suspension leads are configured so as to position said depressed portion accurately within said resin encapsulation region; and
a lead connecting portion which is configured from inner leads which are connected to said dam bars and which have one end positioned within said resin encapsulation region, and from outer leads where another end portion of said inner leads extends to outside said resin encapsulation portion.

2. The lead frame of claim 1, wherein said island suspension leads include a pair of leads that extend into said resin encapsulation region from one dam bar, and that are connected to both ends of one side of said island via said depressed portions, and one lead that extends into said resin encapsulation region from substantially the center of another dam bar, and is connected to a central portion of another side of said island via said depressed portion.

3. The lead frame of claim 2, wherein one pair of island suspension leads connected to one side of said island is also a lead portion for said lead connecting portion that is configured from said inner leads and outer leads.

4. The lead frame of claim 2, wherein said package suspension leads have one end connected to an inner lead of said lead connecting portion positioned at both end portions on both sides of said island, and another end connected to a pair of said outer frames.

5. The lead frame of claim 4, wherein a pair of island suspension leads connected to both ends of one side of said island is also a lead portion for said lead connecting portion that is configured from said inner leads and outer leads.

6. The lead frame of claim 5, wherein said package suspension leads connected to said lead connecting portion that is also said pair of island suspension leads are bent so as to avoid said depressed portion.

7. A lead frame of a depression type for a semiconductor device of a resin encapsulation type, comprising:
a pair of outer frames that are provided parallel to each other and at a constant distance;
an island having a required shape and laid out between said outer frames, and having a semiconductor chip mounted to it and which is to be resin encapsulated along with a carrier chip in a resin encapsulation region;
a pair of dam bars that bridge said pair of outer frames and that are separated by a constant distance from said island on each of two sides of said island;
a plural number of package suspension leads that protrude from said outer frames into said resin encapsulation region and that support a package when there is resin encapsulation, said package suspension leads having one end portion which is connected to said outer frame, and the other end portion extending into said resin encapsulation region;
island suspension leads that have one end connected to said pair of dam bars, and another end connected to said island via a depressed portion for positioning of said islands in a surface parallel to a surface of said dam bars and outer frames, and that is configured so as to position said depressed portion accurately within said resin encapsulation region, said island suspension leads having one end portion which is connected to a side portion of said island that does not oppose said outer frame, and another end portion extending and connected to said outer frame in the direction of a side of said island so that a region of a depressed portion of said island suspension lead is obtained; and a lead connecting portion which is configured from inner leads which are connected to said dam bars and which have one end positioned within said resin encapsulation region, and from outer leads where another end portion of said inner leads extends to outside said resin encapsulation portion;

wherein said island suspension leads are provided as two pairs in both end portions of both sides of said island by said pair of dams, and suspends four corners of said island by said dam bars and via said depressed portion.

8. The lead frame of claim 7, wherein said island suspension leads, provided as two pairs on both sides of said island, are also said lead connecting portion which is configured from said inner leads and outer leads.

9. The lead frame of claim 8, wherein two pairs of lead connecting portions that are said island suspension leads are connected to said package suspension leads by said outer frames.

10. The lead frame of claim 9, wherein said package suspension leads have a bent portion so as to avoid a depressed portion formed by said island suspension leads.

11. The lead frame of claim 1, wherein said lead connecting portion is provided in plural so as to be symmetrical left and right on both sides of said island, and said island suspension leads are provided as two pairs so as to suspend said island via said depressed portions by said dam bar, between a first and a second of said lead connecting portions from both ends of said island.

12. The lead frame of claim 11, wherein said two pairs of end portions of the lead connecting portions positioned at both ends on both sides of said island are connected to said package suspension leads.

13. The lead frame of claim 11, wherein island side end portions of said lead connecting portions provided symmetrically left and right are separated at a constant distance from a side end portion of said island and are positioned within said resin encapsulation region.

14. The combination comprising:

a lead frame of a depression type for a semiconductor device of a resin encapsulation type, said lead frame including package suspension leads having one end portion which is connected to an outer frame, and the other end portion extending into a resin encapsulation region, and island suspension leads having one end portion which is connected to a side portion of an island that does not oppose said outer frame, and another end portion extending and connected to said outer frame in the direction of a side of said island so that a region of a depressed portion of said island suspension lead is obtained; and a resin encapsulation type semiconductor device encapsulated in resin and mounted on said lead frame in said resin encapsulation region.

* * * * *